US011821913B2

(12) United States Patent
Ranganathan et al.

(10) Patent No.: US 11,821,913 B2
(45) Date of Patent: Nov. 21, 2023

(54) SHIELDED SOCKET AND CARRIER FOR HIGH-VOLUME TEST OF SEMICONDUCTOR DEVICES

(71) Applicant: Advantest Test Solutions, Inc., San Jose, CA (US)

(72) Inventors: Karthik Ranganathan, San Jose, CA (US); Samer Kabbani, San Jose, CA (US); Gilberto Oseguera, San Jose, CA (US); Ira Leventhal, San Jose, CA (US); Koji Miyauchi, San Jose, CA (US); Keith Schaub, San Jose, CA (US); Amit Kucheriya, San Jose, CA (US); Kotaro Hasegawa, San Jose, CA (US); Yoshiyuki Aoki, San Jose, CA (US)

(73) Assignee: Advantest Test Solutions, Inc., San Jose, CA (US)

( * ) Notice: Subject to any disclaimer, the term of this patent is extended or adjusted under 35 U.S.C. 154(b) by 68 days.

(21) Appl. No.: 17/491,145

(22) Filed: Sep. 30, 2021

(65) Prior Publication Data

US 2022/0137092 A1   May 5, 2022

Related U.S. Application Data

(60) Provisional application No. 63/108,819, filed on Nov. 2, 2020.

(51) Int. Cl.
*G01R 1/02* (2006.01)
*G01R 1/04* (2006.01)
(Continued)

(52) U.S. Cl.
CPC ....... *G01R 1/0408* (2013.01); *G01R 31/2834* (2013.01)

(58) Field of Classification Search
CPC . G01R 1/02; G01R 1/04; G01R 1/045; G01R 1/067; G01R 1/073; G01R 31/27; G01R 31/28; G01R 31/2822
See application file for complete search history.

(56) References Cited

U.S. PATENT DOCUMENTS 5,126,656 A   6/1992   Jones
5,164,661 A   11/1992  Jones
(Continued)

FOREIGN PATENT DOCUMENTS

CN   101073016      11/2007
CN   101073016 A    11/2007
(Continued)

OTHER PUBLICATIONS

Ranganathan et al. D517: Shielded Socket and Carrier for High-Volume Test of Semiconductor Devices; Powerpoint; 12 pp. Sep. 30, 2021.

*Primary Examiner* — Neel D Shah

(57) ABSTRACT

A test apparatus comprising a tester interface board (TIB) affixed in a slot of a tester rack, wherein the TIB comprises test circuitry and a plurality of sockets, each socket operable to receive a device under test (DUT). The test apparatus further comprises a carrier comprising an array of DUTs, wherein the carrier is operable to slide into the slot of the tester rack, and wherein each DUT in the array of DUTs aligns with a respective socket on the TIB. Further, the test apparatus comprises a plurality of socket covers, wherein each socket cover of the plurality of socket covers is operable to actuate a top portion of each DUT of the array of DUTs in the carrier.

20 Claims, 11 Drawing Sheets

(51) Int. Cl.
*G01R 1/067* (2006.01)
*G01R 1/073* (2006.01)
*G01R 31/27* (2006.01)
*G01R 31/28* (2006.01)

(56) References Cited

U.S. PATENT DOCUMENTS

| | | |
|---|---|---|
| 5,239,093 A | 8/1993 | Cheng |
| 5,315,240 A | 5/1994 | Jones |
| 5,329,093 A | 7/1994 | Okano |
| 5,420,521 A | 5/1995 | Jones |
| 5,738,531 A | 4/1998 | Beaman et al. |
| 5,821,505 A | 10/1998 | Tustaniwskyj et al. |
| 5,909,657 A | 6/1999 | Onishi et al. |
| 6,184,504 B1 | 2/2001 | Cardella |
| 6,359,264 B1 | 3/2002 | Schaper et al. |
| 6,389,225 B1 | 5/2002 | Malinoski et al. |
| 6,452,113 B2 | 9/2002 | Dibene et al. |
| 6,498,899 B2 | 12/2002 | Malinoski et al. |
| 6,515,470 B2 | 2/2003 | Suzuki et al. |
| 6,668,570 B2 | 12/2003 | Wall et al. |
| 6,711,904 B1 | 3/2004 | Law et al. |
| 6,825,681 B2 | 11/2004 | Feder et al. |
| 6,862,405 B2 | 3/2005 | Malinoski et al. |
| 6,985,000 B2 | 1/2006 | Feder et al. |
| 7,042,240 B2 | 5/2006 | Lopez et al. |
| 7,126,217 B2 | 10/2006 | Chiu et al. |
| 7,138,811 B1 | 11/2006 | Mahoney et al. |
| 7,151,388 B2 | 12/2006 | Gopal et al. |
| 7,311,782 B2 | 12/2007 | Strang et al. |
| 7,355,428 B2 | 4/2008 | Kabbani et al. |
| 7,411,792 B2 | 8/2008 | Richards et al. |
| 7,436,059 B1 | 10/2008 | Ouyang |
| 7,519,880 B1 | 4/2009 | Johnson et al. |
| 7,626,407 B2 | 12/2009 | Kabbani |
| 7,646,596 B2 | 1/2010 | Ng |
| 7,659,738 B2 | 2/2010 | Hong |
| 7,726,145 B2 | 6/2010 | Nakamura |
| 7,755,899 B2 | 7/2010 | Stenmark |
| 7,781,883 B2 | 8/2010 | Sri-Jayantha et al. |
| 7,830,164 B2 | 11/2010 | Earle et al. |
| 7,848,106 B2 | 12/2010 | Merrow |
| 7,929,303 B1 | 4/2011 | Merrow |
| 8,343,280 B2 | 1/2013 | Imuro |
| 8,558,540 B2 | 10/2013 | Wu et al. |
| 8,772,682 B2 | 7/2014 | Ambal et al. |
| 8,927,907 B2 | 1/2015 | Fink et al. |
| 8,970,244 B2 | 3/2015 | Di Stefano et al. |
| 9,080,820 B2 | 7/2015 | Bolton |
| 9,291,667 B2 | 3/2016 | Armstrong et al. |
| 9,307,578 B2 | 4/2016 | Pease |
| 9,310,145 B2 | 4/2016 | Colongo et al. |
| 9,414,526 B2 | 8/2016 | Mann et al. |
| 9,494,353 B2 | 11/2016 | Yu et al. |
| 9,594,113 B2 | 3/2017 | Davis et al. |
| 9,766,287 B2 | 9/2017 | Naraski et al. |
| 9,841,772 B2 | 12/2017 | Bucher |
| 10,056,225 B2 | 8/2018 | Gaff et al. |
| 10,126,356 B2 | 11/2018 | Barabi et al. |
| 10,163,668 B2 | 12/2018 | Steinhauser |
| 10,354,785 B2 | 7/2019 | Yamaguchi et al. |
| 10,656,200 B2 | 5/2020 | Cruzan et al. |
| 10,775,408 B2 | 9/2020 | Carvalho et al. |
| 10,908,207 B2 | 2/2021 | Barabi et al. |
| 10,955,466 B2 | 3/2021 | Tsai et al. |
| 10,983,145 B2 | 4/2021 | Akers et al. |
| 11,143,697 B2 | 10/2021 | Wolff |
| 11,493,551 B2 | 11/2022 | Ranganathan et al. |
| 2002/0026258 A1 | 2/2002 | Suzuki et al. |
| 2002/0118032 A1 | 8/2002 | Norris et al. |
| 2003/0155939 A1 | 8/2003 | Lutz et al. |
| 2004/0017185 A1 | 1/2004 | Song et al. |
| 2005/0026476 A1 | 2/2005 | Mok et al. |
| 2005/0086948 A1 | 4/2005 | Milke-Rojo et al. |
| 2005/0103034 A1 | 5/2005 | Hamilton et al. |
| 2005/0151553 A1 | 7/2005 | Kabbani et al. |
| 2005/0169733 A1 | 8/2005 | Drynkin et al. |
| 2006/0158207 A1 | 7/2006 | Reitinger |
| 2006/0290370 A1 | 12/2006 | Lopez |
| 2009/0160472 A1 | 6/2009 | Segawa et al. |
| 2009/0218087 A1 | 9/2009 | Oshima |
| 2010/0042355 A1 | 2/2010 | Aube et al. |
| 2011/0050268 A1 | 3/2011 | Co et al. |
| 2011/0074080 A1 | 3/2011 | Di Stefano et al. |
| 2013/0181576 A1 | 7/2013 | Shiozawa et al. |
| 2013/0285686 A1 | 10/2013 | Malik et al. |
| 2014/0035715 A1 | 2/2014 | Takahashi et al. |
| 2014/0251214 A1 | 9/2014 | Cuvalci et al. |
| 2015/0028912 A1 | 1/2015 | Cho et al. |
| 2015/0137842 A1 | 5/2015 | Murakami et al. |
| 2015/0168450 A1 | 6/2015 | Wooden et al. |
| 2015/0226794 A1 | 8/2015 | Chen |
| 2016/0084880 A1 | 3/2016 | LoCicero et al. |
| 2016/0247552 A1 | 8/2016 | Kim et al. |
| 2016/0351526 A1 | 12/2016 | Boyd et al. |
| 2017/0059635 A1 | 3/2017 | Orchanian et al. |
| 2017/0102409 A1* | 4/2017 | Sarhad ............ G01R 31/31905 |
| 2018/0024188 A1 | 1/2018 | Cruzan et al. |
| 2018/0189159 A1 | 7/2018 | Carmichael et al. |
| 2018/0218926 A1 | 8/2018 | Stuckey et al. |
| 2019/0064254 A1* | 2/2019 | Bowyer ............ G01R 31/2867 |
| 2019/0064261 A1 | 2/2019 | Bowyer et al. |
| 2019/0162777 A1 | 5/2019 | Chiang et al. |
| 2019/0271719 A1 | 9/2019 | Sterzbach |
| 2019/0310314 A1 | 10/2019 | Liu et al. |
| 2019/0346482 A1 | 11/2019 | Kiyokawa et al. |
| 2020/0041564 A1 | 2/2020 | Cojocneanu et al. |
| 2020/0363104 A1 | 11/2020 | Macdonald et al. |
| 2020/0371155 A1 | 11/2020 | Walczyk et al. |
| 2021/0071917 A1 | 3/2021 | Pei et al. |
| 2021/0183668 A1 | 6/2021 | Cagle et al. |
| 2021/0293495 A1 | 9/2021 | Barako et al. |
| 2021/0396801 A1 | 12/2021 | Ranganathan et al. |
| 2022/0044084 A1 | 2/2022 | Cardy |
| 2022/0082587 A1 | 3/2022 | Gopal et al. |
| 2022/0128597 A1 | 4/2022 | McKenna et al. |
| 2022/0128599 A1 | 4/2022 | Campbell et al. |
| 2022/0137092 A1 | 5/2022 | Ranganathan et al. |
| 2022/0137129 A1 | 5/2022 | Ranganathan et al. |
| 2022/0206061 A1 | 6/2022 | Ranganathan et al. |
| 2022/0284982 A1 | 9/2022 | Ranganathan et al. |

FOREIGN PATENT DOCUMENTS

| | | |
|---|---|---|
| CN | 103038751 | 4/2013 |
| CN | 103038751 A | 4/2013 |
| CN | 105144114 A | 12/2015 |
| CN | 109716513 | 5/2019 |
| CN | 110214270 | 9/2019 |
| CN | 110618903 A | 12/2019 |
| EP | 3270261 A1 | 1/2018 |
| JP | 2005156172 A | 6/2005 |
| JP | 2008275512 A | 11/2008 |
| TW | 446682 | 7/2001 |
| TW | 200535440 A | 11/2005 |
| TW | 200620596 | 6/2006 |
| TW | 200628818 | 8/2006 |
| TW | 201226579 | 7/2012 |
| TW | 201229535 | 7/2012 |
| TW | 201323883 | 6/2013 |
| TW | 201323883 A | 6/2013 |
| TW | 201504647 A | 7/2013 |
| TW | 201333497 A | 8/2013 |
| TW | 201447325 | 12/2014 |
| TW | 201636618 A | 12/2014 |
| TW | 201504647 A | 2/2015 |
| TW | 201608254 | 3/2016 |
| TW | 201608254 A | 3/2016 |
| TW | 201636618 A | 10/2016 |
| TW | 201712459 | 4/2017 |
| TW | 201834134 | 9/2018 |
| TW | 201840996 A | 11/2018 |
| TW | I651540 B | 2/2019 |
| TW | 202004980 | 1/2020 |

(56) References Cited

FOREIGN PATENT DOCUMENTS

| | | |
|---|---|---|
| TW | 202043787 | 12/2020 |
| TW | 202043787 A | 12/2020 |
| WO | 2016122039 A1 | 8/2016 |
| WO | 2017015052 A1 | 1/2017 |
| WO | 2017039936 A1 | 3/2017 |
| WO | 2017112076 A1 | 6/2017 |
| WO | 2020159954 A1 | 8/2020 |

* cited by examiner

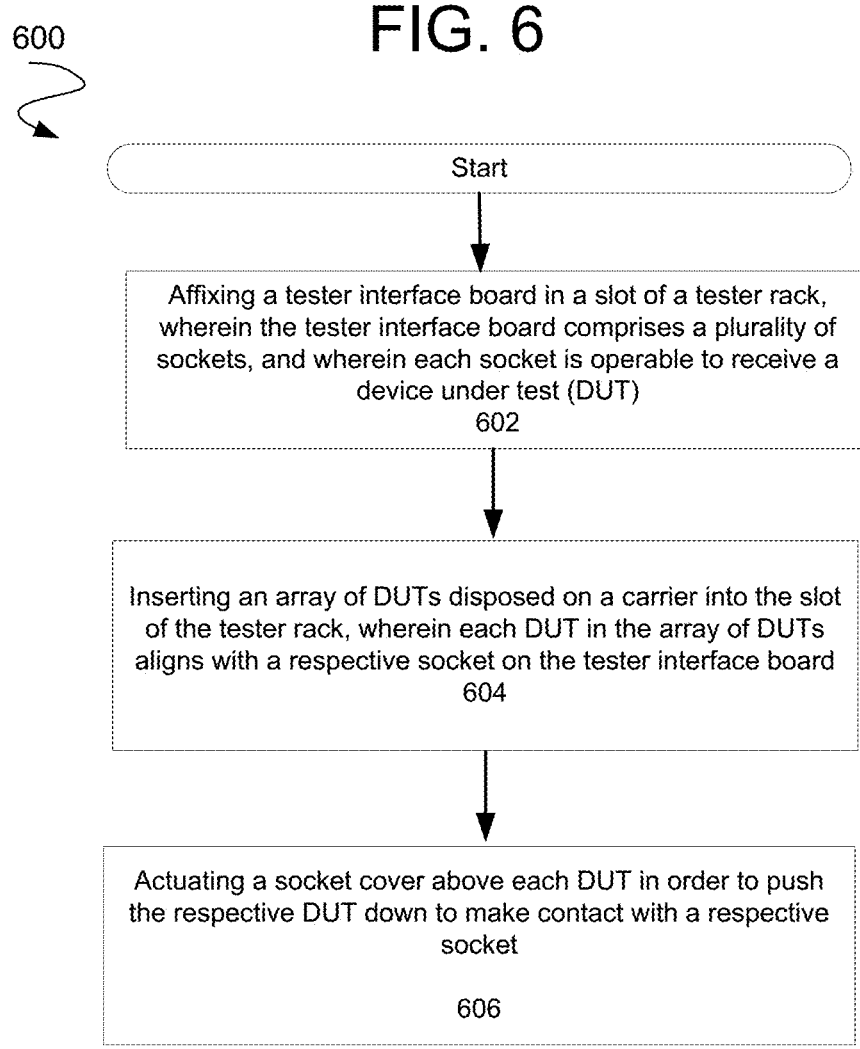

SHIELDED SOCKET AND CARRIER FOR HIGH-VOLUME TEST OF SEMICONDUCTOR DEVICES

CROSS-REFERENCE TO RELATED APPLICATIONS

This application also claims priority to U.S. Provisional Application 63/108,819 titled "Shielded Socket and Carrier for High-Volume Test of Semiconductor Devices," filed on Nov. 2, 2020. The entire contents of the above-listed application is hereby incorporated by reference for all purposes as if fully set forth herein.

FIELD OF THE INVENTION

The present disclosure relates generally to the field of automated test equipment and more specifically to techniques for massively parallel high-volume testing of devices under test.

BACKGROUND OF THE INVENTION

Automated test equipment (ATE) includes any testing assembly that performs a test on a semiconductor wafer or die, an integrated circuit (IC), a circuit board, or a packaged device such as a solid-state drive. ATE assemblies may be used to execute automated tests that quickly perform measurements and generate test results that can then be analyzed. An ATE assembly may be anything from a computer system coupled to a meter, to a complicated automated test assembly that may include a custom, dedicated computer control system and many different test instruments that are capable of automatically testing electronics parts and/or semiconductor wafer testing, such as system-on-chip (SOC) testing or integrated circuit testing. ATE systems both reduce the amount of time spent on testing devices to ensure that the device functions as designed and serve as a diagnostic tool to determine the presence of faulty components within a given device before it reaches the consumer. ATE systems can also be used to test and record device performance for pass/fail and for device binning determinations.

When a typical ATE system tests a device (commonly referred to as a device under test or DUT), the ATE system applies stimuli (e.g. electrical signals) to the device and checks responses (e.g., currents and voltages) of the device. Typically, the end result of a test is either "pass" if the device successfully provides certain expected responses within pre-established tolerances, or "fail" if the device does not provide the expected responses within the pre-established tolerances. More sophisticated ATE systems are capable of evaluating a failed device to potentially determine one or more causes of the failure. Other ATE systems can categorize a performance of a device for binning purposes.

Conventional sockets and carriers used in high-volume testing of DUTs have several drawbacks. One of the conventional testers available in the market today is a classic memory tester and handler. In this particular type of ATE system, the handler uses a pick-and-place mechanism to load DUTs from JEDEC trays into multi-DUT carriers that are moved to the testing chamber. The DUTs remain in the carrier while being simultaneously plunged into sockets which provide the electrical connection with the test equipment in the test system. The problem with these type of test systems is that this solution only works for memory chips (e.g. memory related DUTs) and does not incorporate shields for radio-frequency ("RF") or the top-side contacts of the DUTs.

Another type of conventional tester is a traditional RF-ATE-style system. In this type of ATE, the handler uses a pick-and-place mechanism to load DUTs from JEDEC trays into sockets in a limited number of fixed-location testing sites. The testing sites typically have an independent plunging mechanism to provide the socket force required to make the electrical connection with the test equipment. The test sites are typically electrically shielded to reduce site-to-site interference during testing. One of the drawbacks associated with this type of tester system is that it uses pick and place heads where the pick and place heads drop devices into sockets. Picking and dropping devices into sockets is time consuming. Therefore, this type of tester system does not provide the UPH (units per hour) advantage of batch processing devices which therefore results in in low UPH and limited parallelism.

In another type of currently used tester system, the handler stage contains a pick-and-place mechanism to load DUTs from JEDEC trays into sockets on TIBs (Tester Interface Boards). The TIBs are then moved to the test rack using an elevator stage and inserted into a test slot. The TIB also contains per-DUT test circuitry that is connected to power supplies and instrumentation in the test rack when the TIB is inserted. The biggest drawback with this type of system is that the high-frequency signal path between the socket/per-DUT test circuitry and the equipment in test rack is repeatedly disconnected during normal operation (because the TIBs keep needing to be disconnected), making maintenance of signal fidelity and high-speed signal path calibration difficult. Further, there is an increased cost (initial and maintenance) for high cycle count high-frequency connectors between the TIB and the test rack.

BRIEF SUMMARY OF THE INVENTION

Accordingly, there is a need for an ATE system that addresses the drawbacks associated with conventional ATE tester systems. Using the beneficial aspects of the systems described, without their respective limitations, embodiments of the present invention provide a novel solution to address the drawbacks mentioned above.

Embodiments of the present invention provide high-performance, per-DUT (device under test) electrically shielded test capability suitable for high-volume, high-parallelism test of RF and other high-frequency devices. The solution provided by embodiments of the present invention is scalable, cost-effective, and reliable from small to large configurations, e.g., the solution may be scalable to high volume manufacturing configurations supporting hundreds of DUTs in parallel.

In order to address the drawbacks of conventional testers, embodiments of the present invention provide a tester (including power delivery board and controls) that comprises: a) a tester board such as an ATE load-board or test interface board (TIB) with Socket Interface board (SIB) or Burn-in-Board (BIB); b) an open Socket to hold DUT(s) (Device under test); c) passive carrier/test tray that holds multiple DUTs (note that multiple carriers or test trays are present in the system); d) optionally, a parallel cover assembly system places RF shields on top of device in the carrier; e) a handler and movement system that places devices into the carrier and places devices in the carrier on top of the socket; and f) a plunger pushing down the shields, and the device into the socket.

For high-frequency applications, the socket covers placed over the DUTs together with the passive carrier and socket typically provide the required electrical shielding between DUTs, as well as providing the means for top-side contact as required. In the proposed implementation, since the DUTs remain in the passive carrier during testing, the carrier is an integral part of the shielding design. To keep the DUTs electrically shielded from each other in the carrier, a novel "sandwich" approach is used where the socket, carrier, and socket cover combine to form the per-DUT shielding.

Embodiments of the present invention provide a massively parallel high-volume test capability in a slot-based architecture, using multi-device passive carriers to transport the semiconductor devices from the loading/unloading station to the test slots. This eliminates the requirement to move the test sockets and/or test circuitry with the devices, which is the method used in conventional high-volume test systems. Eliminating this requirement simplifies the design of the system and provides improved performance (especially for RF and other high frequency applications), improved reliability, and reduced cost.

In one embodiment, a test apparatus comprises a tester interface board (TIB) affixed in a slot of a tester rack, wherein the TIB comprises test circuitry and a plurality of sockets, each socket operable to receive a device under test (DUT). The test apparatus further comprises a carrier comprising an array of DUTs, wherein the carrier is operable to slide into the slot of the tester rack, and wherein each DUT in the array of DUTs aligns with a respective socket on the TIB. Further, the test apparatus comprises a plurality of socket covers, wherein each socket cover of the plurality of socket covers is operable to actuate a top portion of each DUT of the array of DUTs in the carrier.

In one embodiment, a method of testing DUTs is disclosed. The method comprises affixing an interface board in a slot of a tester rack, wherein the interface board comprises a plurality of sockets, and wherein each socket of the plurality of sockets is operable to receive a device under test (DUT). The method also comprises inserting an array of DUTs disposed on a carrier into the slot of the tester rack, wherein each respective DUT in the array of DUTs aligns with a respective socket on the interface board. Further, the method comprises actuating a socket cover of a plurality of socket covers onto each DUT in the array of DUTs to push the respective DUT to make contact with a respective socket of the plurality of sockets.

In one embodiment, a tester system is disclosed. The tester system comprises a tester chamber comprising a plurality of slots, wherein each slot of the plurality of slots comprises: (a) an interface board affixed in a respective slot of the tester chamber, wherein the interface board comprises test circuitry and a plurality of sockets, each socket operable to receive a device under test (DUT); (b) a carrier comprising an array of DUTs, wherein the carrier is operable to slide into the respective slot, and wherein each DUT in the array of DUTs aligns with a respective socket on the interface board; and (c) a plunger comprising a plurality of integrated socket covers, wherein the plunger is configured to apply downward force on each of the plurality of integrated socket covers onto a top portion of a respective DUT of the array of DUTs in the carrier.

The following detailed description together with the accompanying drawings will provide a better understanding of the nature and advantages of the present invention.

BRIEF DESCRIPTION OF THE DRAWINGS

Embodiments of the present invention are illustrated by way of example, and not by way of limitation, in the figures of the accompanying drawings and in which like reference numerals refer to similar elements.

FIG. 6 depicts a flowchart of an exemplary process of testing DUTs according to an embodiment of the present invention.

Figure 1A:
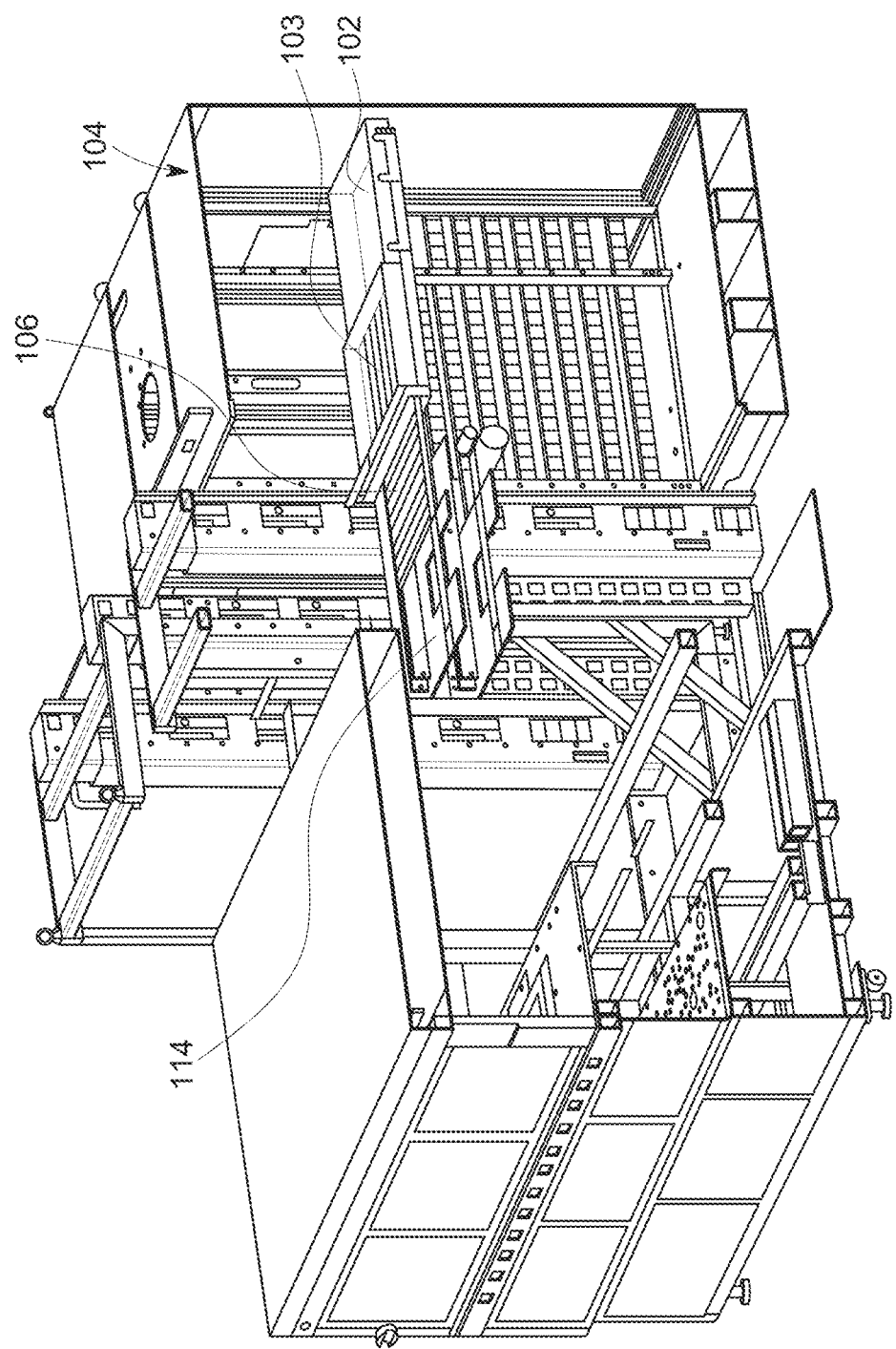
FIG. 1A illustrates a perspective view of a tester system that combines a carrier-based DUT delivery mechanism with a slot-based test architecture in accordance with embodiments of the present invention.

In the figures, elements having the same designation have the same or similar function.

DETAILED DESCRIPTION OF THE INVENTION

Reference will now be made in detail to embodiments, examples of which are illustrated in the accompanying drawings. While the embodiments will be described in conjunction with the drawings, it will be understood that they are not intended to limit the embodiments. On the contrary, the embodiments are intended to cover alternatives, modifications and equivalents. Furthermore, in the following detailed description, numerous specific details are set forth in order to provide a thorough understanding. However, it will be recognized by one of ordinary skill in the art that the embodiments may be practiced without these specific details. In other instances, well-known methods, procedures, components, and circuits have not been described in detail as not to unnecessarily obscure aspects of the embodiments.

Notation and Nomenclature Section

Some regions of the detailed descriptions which follow are presented in terms of procedures, logic blocks, processing and other symbolic representations of operations on data bits within a computer memory. These descriptions and representations are the means used by those skilled in the data processing arts to most effectively convey the substance of their work to others skilled in the art. In the present application, a procedure, logic block, process, or the like, is conceived to be a self-consistent sequence of steps or instructions leading to a desired result. The steps are those requiring physical manipulations of physical quantities. Usually, although not necessarily, these quantities take the form of electrical or magnetic signals capable of being stored, transferred, combined, compared, and otherwise manipulated in a computer system.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing the terms such as "testing," "affixing," "coupling," "inserting," "actuating," or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The description below provides a discussion of computers and other devices that may include one or more modules. As used herein, the term "module" or "block" may be understood to refer to software, firmware, hardware, and/or various combinations thereof. It is noted that the blocks and modules are exemplary. The blocks or modules may be combined, integrated, separated, and/or duplicated to support various applications. Also, a function described herein as being performed at a particular module or block may be performed at one or more other modules or blocks and/or by one or more other devices instead of or in addition to the function performed at the described particular module or block. Further, the modules or blocks may be implemented across multiple devices and/or other components local or remote to one another. Additionally, the modules or blocks may be moved from one device and added to another device, and/or may be included in both devices. Any software implementations of the present invention may be tangibly embodied in one or more storage media, such as, for example, a memory device, a floppy disk, a compact disk (CD), a digital versatile disk (DVD), or other devices that may store computer code.

The terminology used herein is for the purpose of describing particular embodiments only and is not intended to limit the scope of the present invention. As used throughout this disclosure, the singular forms "a," "an," and "the" include plural reference unless the context clearly dictates otherwise. Thus, for example, a reference to "a module" includes a plurality of such modules, as well as a single module, and equivalents thereof known to those skilled in the art.

Shielded Socket and Carrier for High-Volume Test of Semiconductor Devices

In high-frequency applications, there may be a problem with potential interference of signals from one test site to the next. Conventional system level test systems addressed this approach by spacing individual test sites far apart from each other. In these systems, it was easy to put a large shield box around each test site (thereby fully enclosing the test site) to make sure there was no interference. Plus, the spacing ensured that there was less interference and site-to-site cross talk. However, this solution does not work for highly parallel test environments where sockets are located very close to each other. Further, shielding the entire test site only worked in instances where a pick and place mechanism moved the devices individually into stationary test sites.

Embodiments of the present invention provide a tester (including power delivery board and controls) that addresses the problems of conventional testers. As will be explained in detail further below, the tester comprises: a) a tester board such as an ATE load-board or test interface board (TIB) with Socket Interface board (SIB) or Burn-in-Board (BIB); b) an open Socket to hold DUT(s) (Device under test); c) passive carrier/test tray that holds multiple DUTs (note that multiple carriers or test trays are present in the system); d) optionally, a parallel cover assembly system places RF shields/socket covers on top of DUT in the carrier; e) a handler and movement system that places DUTs into the carrier and places DUTs in the carrier on top of the socket; and f) a plunger pushing down the shields, and the DUTs into the socket.

FIG. 1A illustrates a perspective view of a tester system that combines a carrier-based DUT delivery mechanism with a slot-based test architecture in accordance with embodiments of the present invention. The tester system comprises a chamber 104 with multiple racks (e.g., a left and a right rack) with a plurality of slots (e.g., slot 102 in the right rack and slot 103 in the left rack) that can be stacked vertically. Stacking the slots vertically allows more DUTs to be tested in parallel. For example, the chamber 104 can comprise upwards of 30 slots. In a different embodiment, the slots within the tester may be arranged horizontally rather than vertically.

As mentioned previously, the tester system combines the carrier-based device delivery mechanism with the slot-based architecture. The tester system comprises a pick-and-place mechanism (e.g., incorporated within handler 128) that loads the carrier(s) 106 and also further comprises an elevator system 114 that moves the carrier vertically to a particular desired spot. The rationale behind using the passive carrier or test tray is that all the test electronic circuitry can remain in place in the test rack while the carrier can be moved into and out of the tester. As a result, the TIBs and/or SIBs advantageously do not need to be disconnected from the tester system. This has advantages for high-speed applications where the tester needs to maintain a stable and high accuracy signal path.

Conventional tester systems by comparison connect and disconnect test electronics from the sockets any time new DUTs are inserted into the test racks. This would not be ideal for high speed signal paths which require robust connectivity, repeatability and accuracy of signals. Embodiments of the present invention advantageously leave the test circuitry in place. This has advantages for high speed signal paths and provides reliable connectivity, repeatability and accuracy of signals.

The high-parallelism architecture provided by embodiments of the present invention is advantageous because the test sockets and test circuitry remain in place in a fixed location with continuous connections to test instrumentation and supporting resources during normal test operations. An example application is an RF or other high-frequency test. In order to maintain signal fidelity over repeated insertions of the DUTs, the TIBs (Tester Interface Boards) with the sockets and corresponding per-DUT test circuitry remain fixed in the test rack of the system, and are only removed and disconnected for servicing. Since high-frequency testing requires specialized and costly instrumentation, it is not technically or financially feasible to build this equipment into the TIB, so the high-frequency signals must pass through connectors between the TIB and the test equipment in the test rack. Accordingly, it is important that the connectors not be displaced each time a new set of DUTs need to be tested.

In conventional System Level Test (SLT) systems, the TIBs move back-and-forth between the pick-and-place assembly for loading/unloading of the DUTs and the test rack for testing, requiring repeated disconnecting/reconnecting of the signal paths between the test rack and the DUTs. In other words, the TIB would need to be regularly disconnected and pulled out of the slots in order to load new batches of DUTs.

In the tester assembly of the present invention, the TIB does not need to be removed in and out of the slot. It remains in place connected and does not need to be disconnected to load a fresh batch of DUTs. With the TIBs remaining fixed in the test rack in accordance with embodiments of the present invention, the tester system uses a passive carrier or test tray 106 (shown in FIG. 1A) to move the DUTs between the pick-and-place assembly and the test rack. This maintains high-parallelism and high UPH (units per hour) without requiring repeated disconnects of the signal paths. During testing, the entire passive carrier 106 with multiple DUTs is inserted into a slot in the test rack, and lowered onto the fixed TIB. The DUTs remain in the carrier while per-DUT socket covers in the test rack are applied to provide the necessary force between the DUT and socket to complete the electrical connections. It should be noted that fixing the TIBs in the rack also provides additional flexibility to add external equipment and wiring into the test rack.

In one embodiment, the socket covers may be part of a parallel socket cover assembly system that places socket covers on all the DUTs in the carrier before a plunger is used to actuate the DUTs. Actuating the DUTs means to apply contact force on top of the DUTs to push them down to make electrical contact with the socket electronics. In other words, the socket covers are placed on the DUTs by the parallel cover assembly system. The parallel cover assembly system may be similar to the one described in U.S. patent application Ser. No. 16/986,037, entitled, "Integrated Test Cell Using Active Thermal Interposer (ATI) with Parallel Socket Actuation," filed in Aug. 5, 2020, which is hereby incorporated by reference in its entirety for all purposes. In a different embodiment, however, where no parallel cover assembly system is used, a plunger with a built-in socket cover may be used to push down on the DUTs in the carrier to make contact with the respective sockets.

Embodiments of the present invention eliminate the key disadvantages of the conventional tester systems. The high-parallelism architecture of existing HVM (High-Volume Manufacturing) SLT systems is adapted for high-frequency test applications by incorporating the necessary test equipment, shielding, and high-speed signal paths (cabling, connectors, board traces, etc.). In order to maintain signal fidelity over repeated insertions, the TIBs (Tester Interface Boards) with the sockets and corresponding per-DUT test circuitry remain fixed in the test rack of the system, and are only removed and disconnected for servicing.

With the TIBs remaining fixed in the test rack, embodiments of the present invention use a passive carrier 106 (as shown in FIG. 1A) or test tray to move the DUTs between the pick-and-place assembly and the test rack (or test chamber 104). This maintains a high-parallelism and high UPH (units per hour) without requiring repeated disconnects of the high-frequency signal paths.

In an embodiment, during testing, the entire carrier with multiple DUTs is inserted into a slot in the test rack, and lowered onto the fixed TIB. The DUTs remain in the carrier while per-DUT socket covers in the test rack are applied to provide the necessary force between the DUT and socket to complete the electrical connections. In one embodiment, the socket covers are typically aligned with pogo pins on top of the device or socket to enable the socket covers to form an RF shield in collaboration with the carrier and the socket. As noted above, a parallel cover assembly system may be used to place the socket covers onto the DUTs. In a different embodiment, however, a plunger that has an integrated socket cover may be used to push down on each DUT in the carrier to make contact with the respective socket.

The typical users of the tester system disclosed herein would be integrated device manufacturers, fabless semiconductor manufacturers, and outsourced semiconductor assembly and test companies engaged in the high-volume manufacturing and test of devices that operate in frequency ranges requiring careful maintenance of signal fidelity between test equipment and DUTs and electrical shielding to reduce interference between individual DUTs during testing. An example DUT would be an RF module used in a mobile phone for communications with a cell tower. Embodiments of the present invention are integral to handling and interfacing solutions included as part of an ATE (Automated Test Equipment) or SLT (System-level Test) system.

In one embodiment, the DUTs on the carrier tray 106 may be spaced fairly close to each other and need to be shielded, e.g., in the case of RF DUTs. Because of the proximity between the DUTs, there is a high potential of cross-talk between devices. Plus, there is less space to be able to introduce the shielding on a per-socket basis. In one embodiment, therefore, because the carrier stays in place during testing, the carrier structure itself is incorporated into the shielding as well. For high-frequency applications, the socket covers, together with the socket, typically provide the required electrical shielding between DUTs, as well as providing the means for top-side contact as required. In the proposed implementation, since the DUTs remain in the carrier during testing, the carrier needs to be an integral part of the shielding design. To address this issue, a novel "sandwich" approach is used where the socket, carrier, and socket cover combine to form the per-DUT shielding.

Figure 1C:
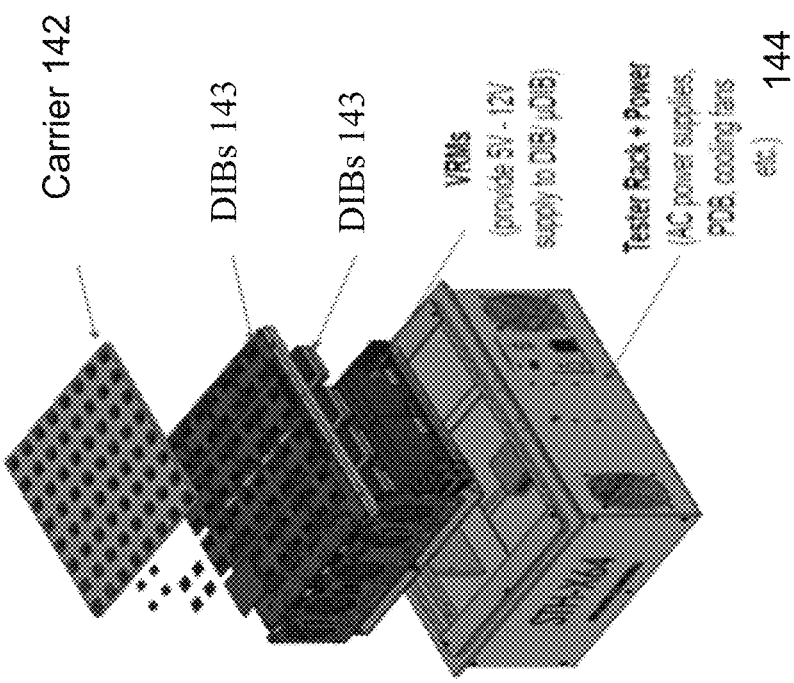
FIG. 1C illustrates a Small DUT Tester Head (SDTH) with a carrier that supports a shielded socket and passive carrier in accordance with embodiments of the present invention.
Figure 1B:
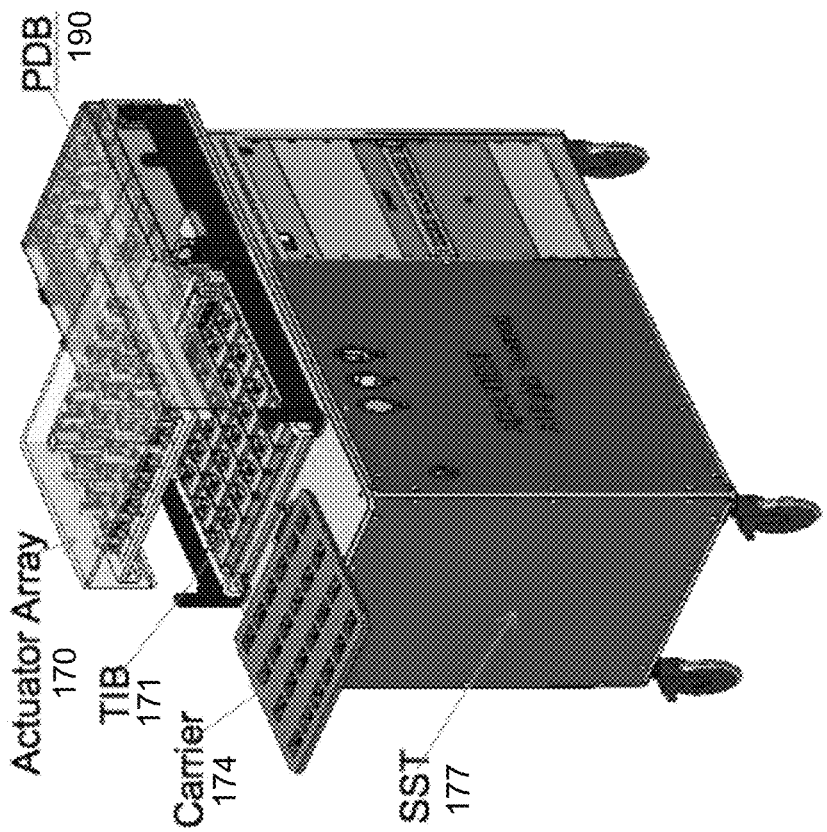
FIG. 1B illustrates a Single Slot Tester (SST) with a carrier that supports a shielded socket and passive carrier in accordance with embodiments of the present invention.

Note that the shielded socket and carrier approach covered by embodiments of the present invention are not limited to a tester rack with vertical slots such as the one shown in FIG. 1A. FIGS. 1B and 1C illustrate other tester systems that may also support the shielded socket and carrier in accordance with embodiments of the present invention.

FIG. 1B illustrates a Single Slot Tester (SST) with a carrier that supports a shielded socket and passive carrier in accordance with embodiments of the present invention. As shown in FIG. 1B, the SST 177 comprises a TIB 171 with a power distribution board 190 and an actuation array 170. In one embodiment, the actuator array 170 may comprise a parallel cover assembly system configured to place the socket covers onto the DUTs after the carrier 174 has been inserted into the tester and one or more plungers to actuate the socket covers by applying contact force on them. In a different embodiment, the plungers may comprise built-in socket covers that apply contact force to the DUTs directly in order to make electrical contact with the socket (without a parallel cover assembly system).

Similar to the tester system of FIG. 1A, the DUTs in the system show in FIG. 1B can also be inserted and removed from the tester system without disconnecting the TIB, which is beneficial for maintaining high-parallelism and high UPH (units per hour) of without requiring repeated disconnects of the signal paths. This can be particularly advantageous for high-frequency and RF applications.

FIG. 1C illustrates a Small DUT Tester Head (SDTH) with a carrier that supports a shielded socket and passive carrier in accordance with embodiments of the present invention. The shielded socket and carrier methodology discussed above may also work with a small DUT tester head as illustrated in FIG. 1C. The SDTH may comprise a carrier 142 that is used to load the DUTs into the SDTH. The SDTH may also comprise device interface boards (DIBs) 143 comprising the sockets (for carrying the DUTs), USB ports, JTAG ports and UART ports. Additionally, the SDTH may comprise a tester rack and power supplies 144. In principle, the carrier 142 is used similarly to the systems illustrated in FIGS. 1A and 1C. It is used to load and unload the DUTs from the tester track. In one embodiment, an actuation system (not shown) similar to the one discussed in connection with FIG. 1B may be used to exercise the necessary force to complete the connections between the DUTs and the sockets on the DIBs 143.

Figure 2A:
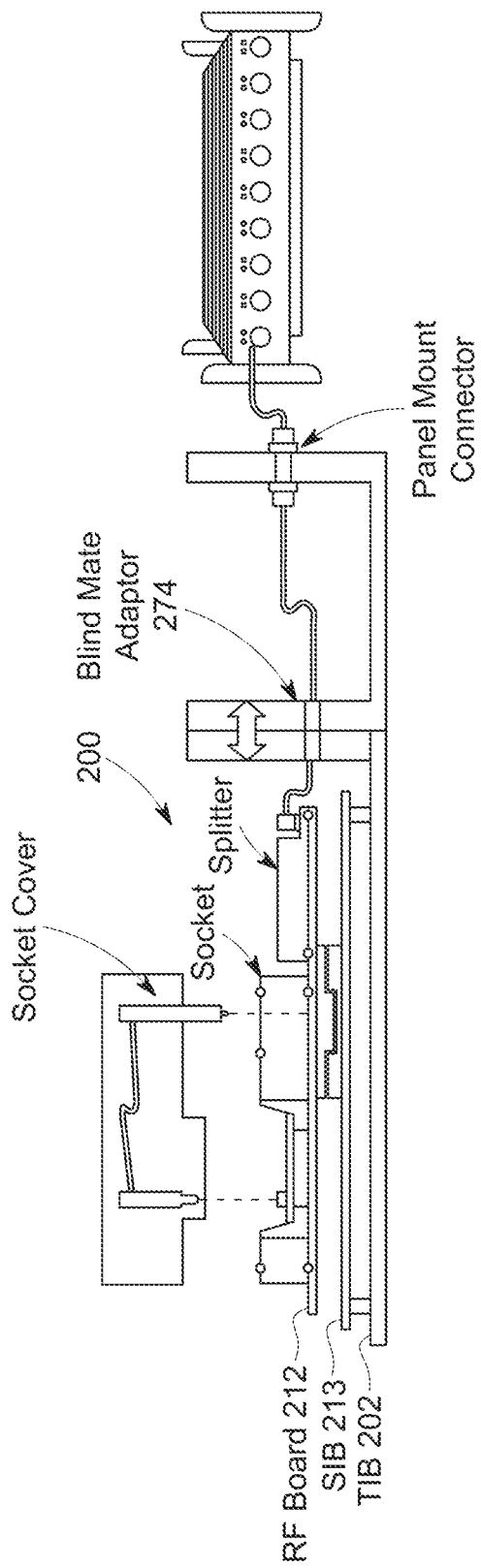
FIG. 2A is an illustration of a TIB placed in a slot of a conventional tester.

FIG. 2A is an illustration of a TIB placed in a slot 200 of a conventional tester. As shown in FIG. 2A, the TIB 202 in conventional testers is configured to slide in and out of the slot each time a new batch of DUTs needs to be loaded. The RF board 212 may be affixed to the SIB 213 which is affixed to the TIB 202. In a conventional tester the entire TIB 202 and all the attached components may need to be disconnected from the tester. The TIB slides out of the slot, new DUTs are loaded and the TIB then slides back into the slot with the new DUTs for further testing. A blind mate adaptor 274 connects the TIB to the tester rack. As shown in FIG. 2A, the entire TIB 202 with the attached RF board 212 slides out and then slides back in with a new batch of DUTs and makes contact with the blind mate adaptor 274 to connect the TIB to the tester rack.

Figure 2B:
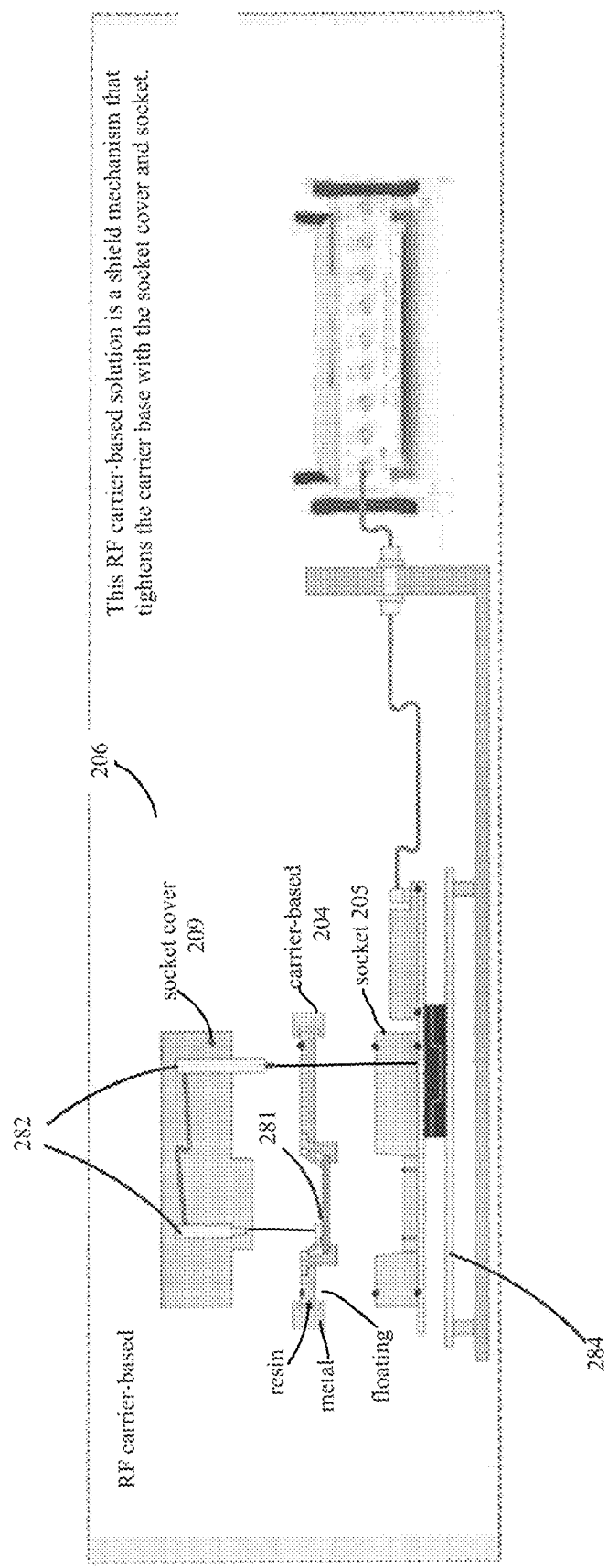
FIG. 2B is an illustration of a TIB that remains fixed in a slot of a tester rack while a passive carrier tray (discussed above) slides into the slot to move DUTs into the tester rack in accordance with embodiments of the present invention.

FIG. 2B is an illustration of a TIB that remains fixed in a slot 206 of a tester rack while a passive carrier tray 204 (discussed above) slides into the slot to move DUTs into the tester rack in accordance with embodiments of the present invention. The carrier tray slides in on top of the socket 205 and the socket cover 209 is lowered, using a plunger for example, to push the DUT 281 down into the socket to make contact. Note that while FIG. 2B only shows a single socket, the passive carrier is capable of carrying an array of DUTs that are aligned with and lowered onto an array of sockets. Similarly, a socket actuator array can comprise an array of socket covers (e.g., socket cover 209) that correspond to the array of DUTs and the array of sockets on the TIB. In one embodiment, a parallel cover assembly system may be used to position the socket covers onto the DUTs before the socket actuator array pushes the socket covers onto the DUTs. In a different embodiment, the socket actuator array may comprise plungers with integrated socket covers that are used to actuate the DUTs.

In one embodiment, the carrier tray 204 is sandwiched between the socket covers and the TIB comprising the sockets. The socket covers (which may be part of an actuator array) pushes the DUTs down into the sockets. The DUTs on the carrier are situated in respective pockets of the carrier on a thin membrane. The DUTs rest on the membrane and get pushed into the socket. The bottom of the DUTs comprises a ball-grid array where the solder balls of the ball-grid array get pushed through the membrane to make contact with the socket. In one embodiment, the socket covers will typically be aligned with pogo pins 282 on top of the device or socket to enable a socket cover 209 in the socket cover array to form an RF shield in collaboration with the carrier 204 and the respective socket 205. After the DUTs are done testing, the actuator array rises back up and the carrier slides back out of the slot with the DUTs on it. In the tester therefore, all the TIBs are able to stay in the slot while the carriers are moved in and out of the various slots.

As mentioned above, socket covers (e.g., socket cover 209) in the test rack are applied to provide the necessary force between the DUT and socket to complete the electrical connections. For high-frequency applications, these covers 209, together with the socket 205, typically provide the required electrical shielding between DUTs, as well as providing the means for top-side contact as required. Embodiments of the present invention sandwich the carrier 204 between the socket cover 209 and the socket 205 to provide per-DUT shielding. The socket cover 209, the carrier 204 and the socket 205 together create the RF shield. Note that each carrier (e.g., carrier 204) comprises an array of DUTs on it (e.g., an x-y matrix of DUTs). The carrier is pushed onto a TIB 284 that has the sockets (e.g., socket 205) on it. There is also an array of socket covers (e.g., socket cover 209) above the carrier that are pushed onto the carrier and the sockets so that the socket cover, the carrier and the socket together form an RF shield. Each combination of a socket, the carrier and a socket cover creates a separate RF shield that isolates the respective enclosed DUT from other DUTs on the carrier.

Figure 2C:
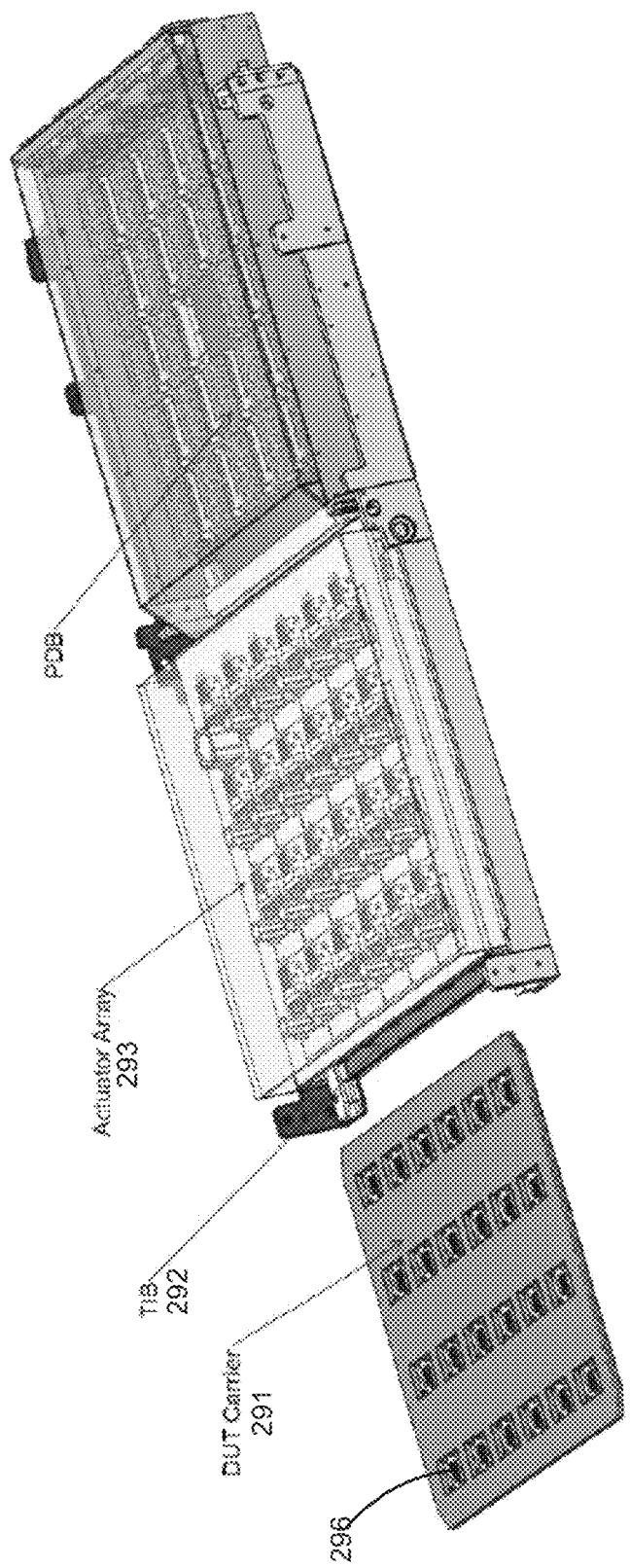
FIG. 2C provides a top view of the manner in which a carrier slides into a slot in accordance with an embodiment of the present invention.

FIG. 2C provides a top view of the manner in which a carrier slides into a slot in accordance with an embodiment of the present invention. As shown in FIG. 2C, the DUT carrier 291 comprises an array of DUTs 296. The DUT carrier 291 slides into the slot so that the DUTs on the carrier tray are aligned with the sockets disposed on TIB 292. The actuator array 293 is then used to actuate the DUTs onto the sockets as discussed above.

Figure 3:
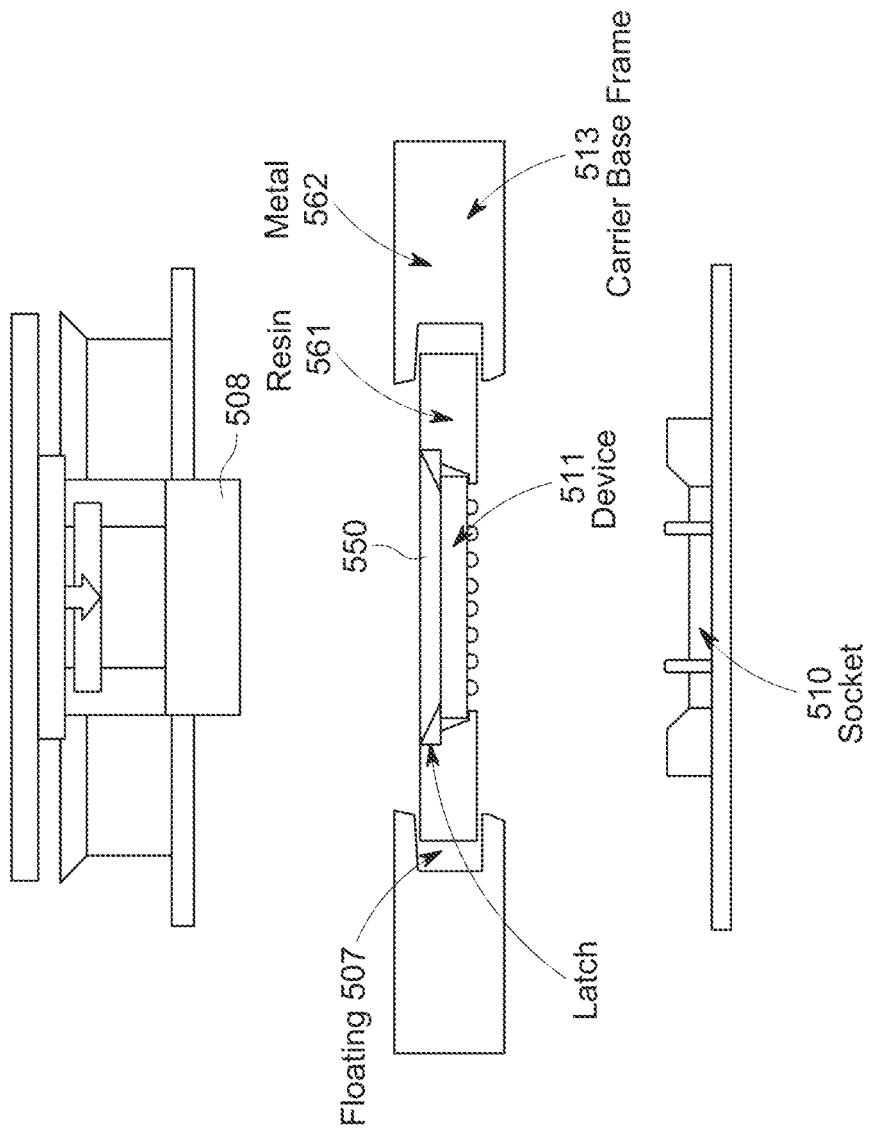
FIG. 3 illustrates the manner in which the socket, the carrier, and the socket cover combine to form the per-DUT shielding in accordance with embodiments of the present invention.
Figure 3:
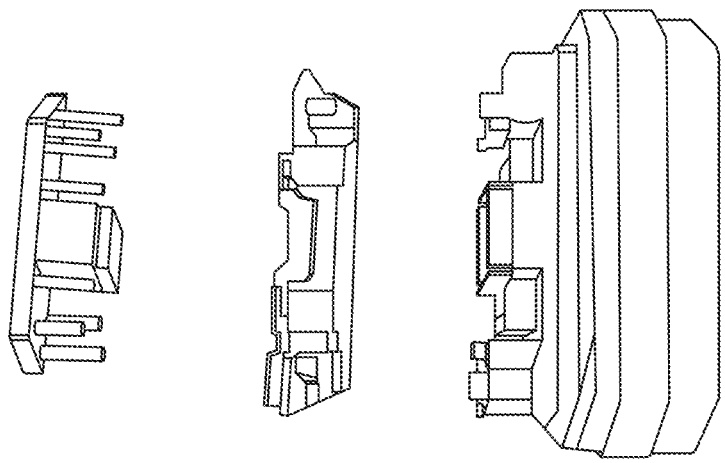

FIG. 3 illustrates the manner in which the socket, the carrier, and the socket cover combine to form the per-DUT shielding in accordance with embodiments of the present invention. In one embodiment, the DUT 311 is latched into place in a floating configuration 307 within the carrier base frame 313. The carrier base frame 313 holds the individual floating per DUT carrier elements. That carrier base frame 313 comprises a metal component 362 and a resin component 361, which holds the DUT 311 in place. The floating configuration ensures compliance in the x, y, and z direction. The DUTs on the carrier are situated in respective pockets of the carrier on a thin membrane 350.

The embodiment of FIG. 3 may comprise a plunger 308 with an integrated socket cover. The DUTs (e.g., device 311) rest on the membrane and the solder balls of the DUTs push through the membrane 350 and make contact with the socket 310 when the plunger 308 pushes down on the DUT 311. In other words, the plunger 308 pushes the DUT 311 into the socket 310 and applies force, so that the solder balls make electrical contact with the socket 310. Note that the embodiments of FIGS. 2B and 3 only show a single element of a 2D array of elements all held within a common carrier base frame.

In one embodiment, the per-DUT RF shields are formed though the novel combination of a plurality of socket covers, a carrier containing a plurality of floating per-DUT carrier elements, and a plurality of sockets. The floating design of the per-DUT carrier elements provides both mechanical compliance to compensate for tolerance variations across the full structures of the TIBs that are housed in the test slots, as well as electrical isolation between the per-DUT carrier elements. After the carrier is inserted into the test slot, the socket covers are actuated, resulting in the compression of the per-DUT cover, carrier element, and socket. A flange or similar mechanically compliant and electrically conductive means is used on the top and bottom of the carrier elements to provide hermetic seals between the layers of each sandwich of the per-DUT cover, carrier element, and socket. The socket covers and sockets have already been designed to provide electrical shielding on the top and bottom, respectively, so the hermetically sealed sandwich provides the required per-DUT electrical isolation.

Figure 4:
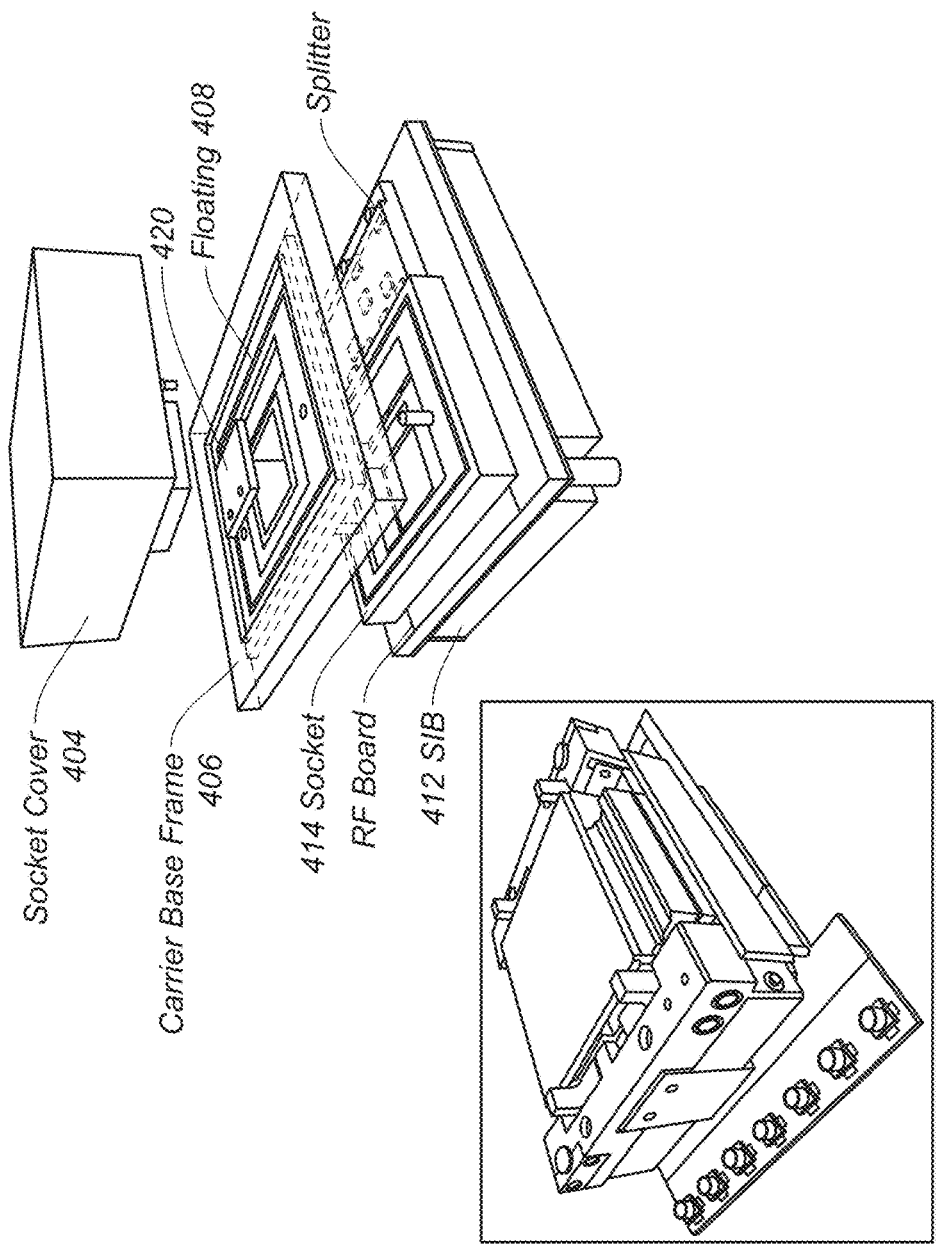
FIG. 4 also illustrates the manner in which the socket, the carrier, and the socket cover combine to form the per-DUT shielding in accordance with embodiments of the present invention.

FIG. 4 also illustrates the manner in which the socket, the carrier, and the socket cover combine to form the per-DUT shielding in accordance with embodiments of the present invention. As shown in FIG. 4, in one embodiment, the DUT 420 is latched into place in a floating configuration 408 within the carrier base frame 406. The carrier base frame 406 holds the individual floating per DUT carrier elements. The solder balls on the DUT 420 make contact with the socket 414 (disposed on an SIB 412) when the socket cover 404 pushes down on the DUT 420.

Figure 5A:
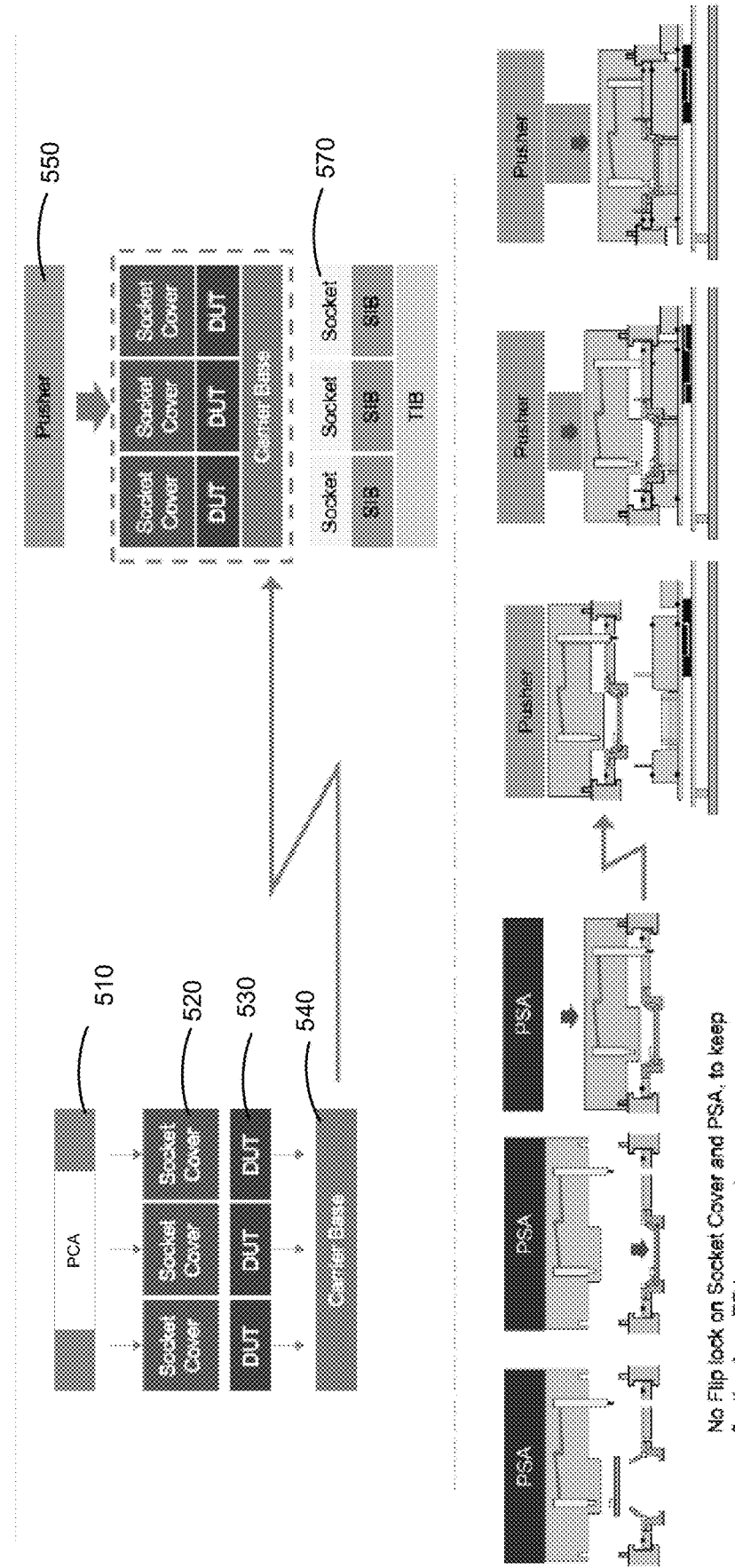
FIG. 5A depicts the manner in which a parallel cover assembly system can be used to place the socket covers onto the DUTs before they are actuated in accordance with an embodiment of the present invention.

FIG. 5A depicts the manner in which a parallel cover assembly system can be used to place the socket covers onto the DUTs before they are actuated in accordance with an embodiment of the present invention. As shown in FIG. 5A, in one embodiment, a parallel cover assembly system 510 places the socket covers 520 onto the DUTs 530 in carrier 540. Subsequently, a plunger (or pusher) 550 can apply contact force on the socket cover, DUTs and the carrier base to push the DUTs down to make contact with the respective sockets 570.

Figure 5B:
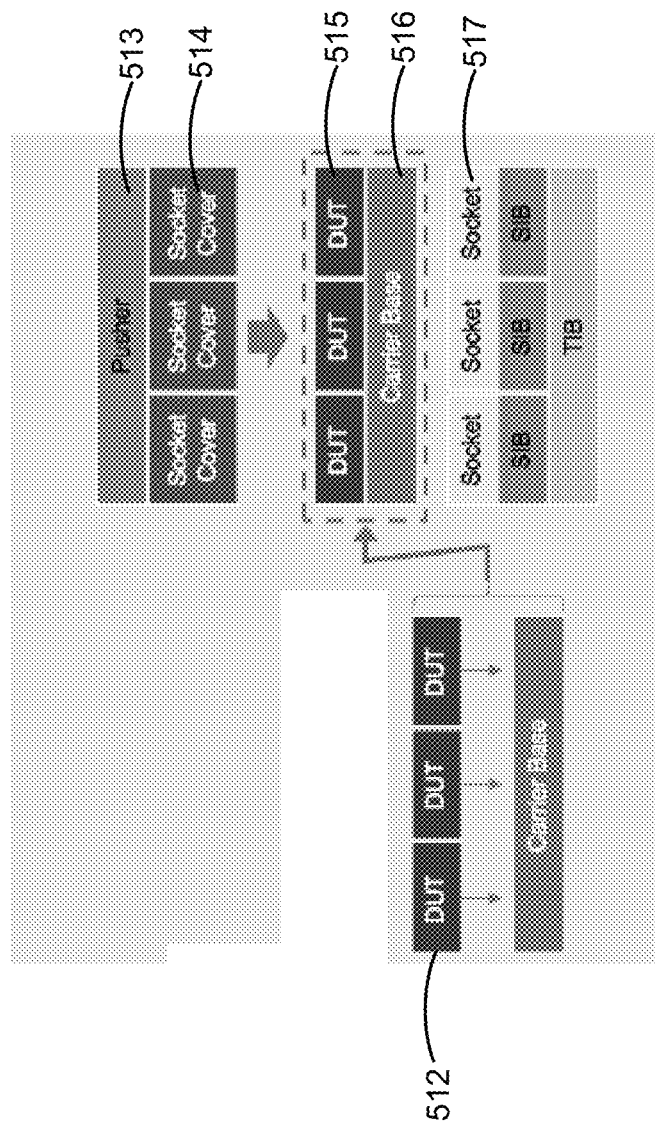
FIG. 5B depicts the manner in which a plunger with built-in socket covers actuates the DUTs directly in accordance with an embodiment of the present invention.

FIG. 5B depicts the manner in which a plunger with built-in socket covers actuates the DUTs directly in accordance with an embodiment of the present invention. After the DUTs 512 are placed in the carrier base and slid into the slots, a plunger 512 with built-in socket covers 514 may be used to actuate the DUTs 515 and push down on the DUTs in the carrier base 516 until the DUTs make electrical contact with the respective sockets 517.

Figure 5C:
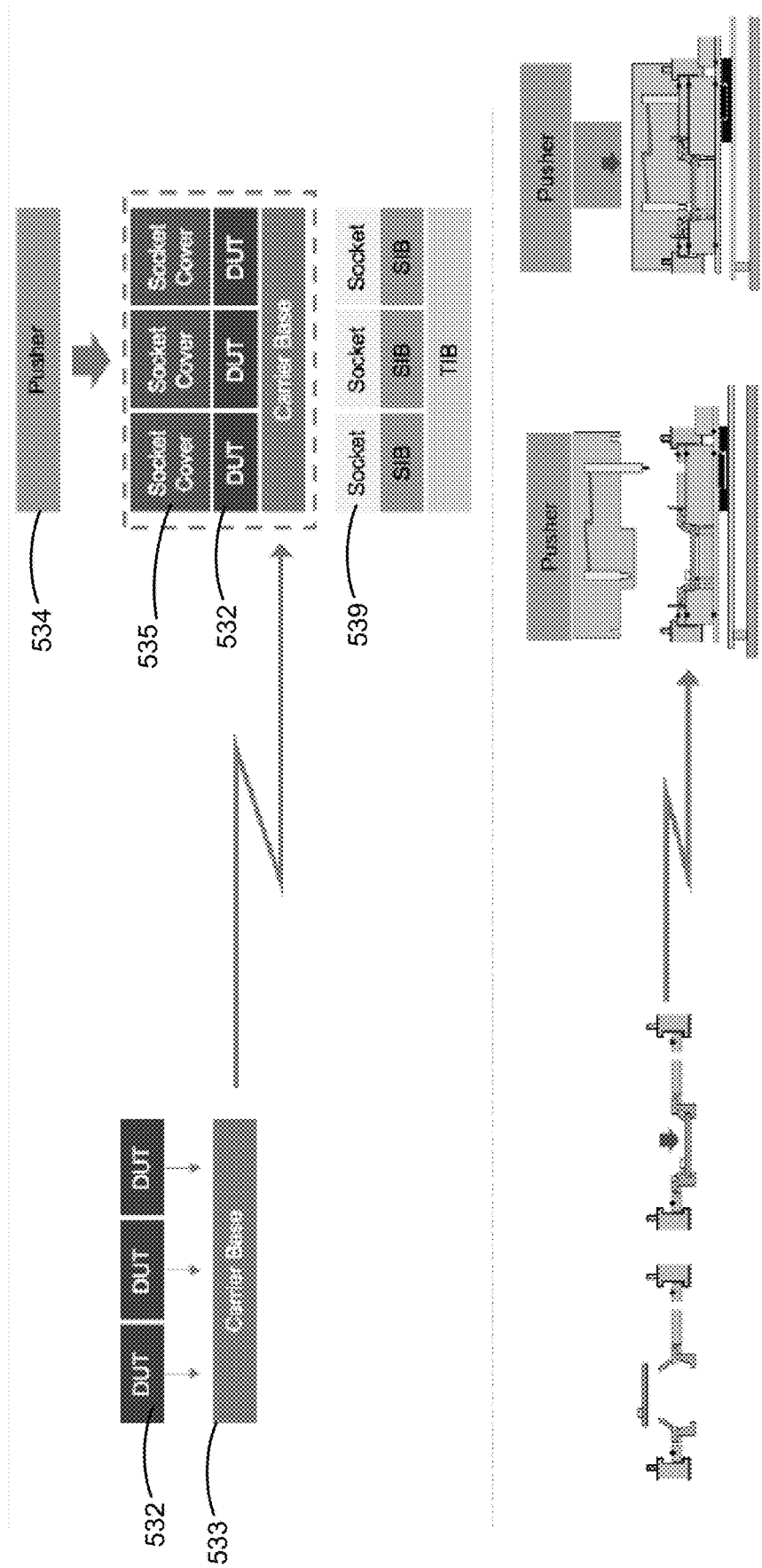
FIG. 5C depicts the manner in which a plunger is used to actuate the socket covers to push down DUTs in a carrier base into their respective sockets in accordance with an embodiment of the present invention.

FIG. 5C depicts the manner in which a plunger is used to actuate the socket covers to push down DUTs in a carrier base into their respective sockets in accordance with an embodiment of the present invention. As shown in FIG. 5C, in one embodiment, the DUTs 532 are placed in a carrier base 533 and slid into the slot. Thereafter, a plunger 534 may be used to push down on socket covers 535 to allow the DUTs 532 to come into electrical contact with the respective sockets 539.

FIG. 6 depicts a flowchart of an exemplary process of testing DUTs according to an embodiment of the present invention. The embodiments of the invention, however, are not limited to the description provided by flowchart 600. Rather, it will be apparent to persons skilled in the relevant art(s) from the teachings provided herein that other functional flows are within the scope and spirit of the present invention.

At block 602, a tester interface board (TIB) is affixed in a slot of a tester rack, wherein the tester interface board comprises a plurality of sockets, and wherein each socket is operable to receive a device under test (DUT).

At block 604, an array of DUTs is disposed on a carrier (e.g., a passive carrier tray) inserted into the slot of the tester rack, wherein each DUT in the array of DUTs aligns with a respective socket on the tester interface board.

At block 606, a socket cover above each DUT is actuated in order to push the respective DUT down to make contact with a respective socket.

At step 608, each DUT in the array of DUTs is tested.

The foregoing description, for purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the invention and its practical applications, to thereby enable others skilled in the art to best utilize the invention and various embodiments with various modifications as may be suited to the particular use contemplated.

What is claimed is:

1. A test apparatus comprising:
an interface board affixed in a slot of a tester rack, wherein the interface board comprises test circuitry and a plurality of sockets, each socket operable to receive a device under test (DUT);
a carrier comprising an array of DUTs and a plurality of membrane pockets operable to hold the array of DUTs, wherein the carrier is operable to be inserted into the slot of the tester rack, and wherein each DUT in the array of DUTs aligns with a respective socket of the plurality of sockets on the interface board; and
a plurality of socket covers, wherein each socket cover of the plurality of socket covers is operable to actuate a top portion of each DUT of the array of DUTs in the carrier to cause each DUT to push through a respective membrane pocket to contact the respective socket.

2. The test apparatus of claim 1, wherein each respective socket cover of the plurality of socket covers is actuated by applying downward force on the top portion of each respective DUT.

3. The test apparatus of claim 1, wherein each respective socket of the plurality of sockets, the carrier and an associated respective socket cover of the plurality of socket covers together form an RF shield around an associated DUT.

4. The test apparatus of claim 1, wherein the plurality of socket covers are associated with a parallel cover assembly system configured to align and place each of the plurality of socket covers over a respective DUT from the array of DUTs.

5. The test apparatus of claim 1, further comprising:
a plunger operable to push down on each socket cover of the plurality of socket covers to bring a respective DUT into closer contact with a respective socket.

6. The test apparatus of claim 1, wherein each respective socket of the plurality of sockets, the carrier and an associated respective socket cover of the plurality of socket covers together form an RF shield around an associated DUT, wherein the associated DUT comprises an RF device.

7. The test apparatus of claim 1, wherein each DUT in the array of DUTs is held in the respective membrane pocket of the carrier, wherein a ball-grid array on the bottom of each DUT is operable to push through the respective membrane pocket to contact the respective socket when a respective socket cover is actuated.

8. The test apparatus of claim 1, wherein each socket cover of the plurality of socket covers is aligned with a respective socket using pogo pins.

9. A method of testing DUTs comprising:
affixing an interface board in a slot of a tester rack, wherein the interface board comprises a plurality of sockets, and wherein each socket of the plurality of sockets is operable to receive a device under test (DUT);

inserting an array of DUTs disposed on a carrier into the slot of the tester rack, wherein the carrier comprises a plurality of membrane pockets operable to hold the array of DUTs, wherein each respective DUT in the array of DUTs aligns with a respective socket on the interface board; and actuating a socket cover of a plurality of socket covers onto each DUT in the array of DUTs to push the respective DUT to push through a respective membrane pocket to make contact with the respective socket of the plurality of sockets.

10. The method of claim 9, wherein each respective socket of the plurality of sockets, the carrier and an associated respective socket cover of the plurality of socket covers together form an electrical shield around an associated DUT.

11. The method of claim 9, wherein each respective socket of the plurality of sockets, the carrier and an associated respective socket cover of the plurality of socket covers together form an RF shield around an associated DUT, wherein the associated DUT comprises an RF device.

12. The method of claim 9, wherein the plurality of socket covers are placed onto the array of DUTs using a parallel cover assembly system configured to simultaneously align and place each of the plurality of socket covers on a respective DUT of the array of DUTs.

13. The method of claim 9, wherein each DUT in the array of DUTs is held in the respective membrane pocket of the carrier, wherein a ball-grid array on the bottom of each DUT is operable to push through the respective membrane pocket to make contact with the respective socket of the plurality of sockets when a respective socket cover of the plurality of socket covers is actuated.

14. A tester system comprising:

a tester chamber comprising a plurality of slots, wherein each slot of the plurality of slots comprises:

an interface board affixed in a respective slot of the tester chamber, wherein the interface board comprises test circuitry and a plurality of sockets, each socket operable to receive a device under test (DUT);

a carrier comprising an array of DUTs and a plurality of membrane pockets operable to hold the array of DUTs, wherein the carrier is operable to slide into the respective slot, and wherein each DUT in the array of DUTs aligns with a respective socket on the interface board; and a plunger comprising a plurality of integrated socket covers, wherein the plunger is configured to apply downward force on each of the plurality of integrated socket covers onto a top portion of a respective DUT of the array of DUTs in the carrier to cause the respective DUT to push through a respective membrane pocket to contact the respective socket.

15. The tester system of claim 14, wherein each respective socket of the plurality of sockets, the carrier and an associated respective integrated socket cover of the plurality of integrated socket covers together form an electrical shield around an associated DUT.

16. The tester system of claim 14, wherein each respective socket of the plurality of sockets, the carrier and an associated respective integrated socket cover of the plurality of integrated socket covers together form an RF shield around an associated DUT, wherein the associated DUT comprises an RF device.

17. The tester system of claim 14, wherein the array of DUTs comprises RF devices.

18. The tester system of claim 14, wherein each DUT in the array of DUTs is held in the respective membrane pocket of the carrier, wherein a ball-grid array on the bottom of each DUT is operable to push through the respective membrane pocket to make contact with the respective socket when a respective integrated socket cover is actuated.

19. The tester system of claim 14, wherein each integrated socket cover of the plurality of integrated socket covers is aligned with a respective socket using pogo pins.

20. The tester system of claim 14, further comprising an elevator operable to move the carrier vertically to the respective slot.

* * * * *